(12) United States Patent
Komuro

(10) Patent No.: US 6,316,328 B1
(45) Date of Patent: *Nov. 13, 2001

(54) FABRICATION METHOD FOR SEMICONDUCTOR DEVICE UTILIZING PARALLEL ALIGNMENT SLITS

(75) Inventor: Masahiro Komuro, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/265,467

(22) Filed: Mar. 10, 1999

Related U.S. Application Data

(62) Division of application No. 08/807,327, filed on Feb. 27, 1997, now Pat. No. 5,949,145.

(30) Foreign Application Priority Data

Feb. 28, 1996 (JP) .................................................... 8-041048

(51) Int. Cl.[7] .................................................... H01L 21/76
(52) U.S. Cl. .......................... 438/401; 438/462; 438/637; 438/638; 438/975
(58) Field of Search .............................. 257/98, 620, 758, 257/760, 774, 797, 786; 438/637, 638, 639, 647, 669, 671, 401, 462, 975

(56) References Cited

U.S. PATENT DOCUMENTS

| | | | |
|---|---|---|---|
| 5,106,432 | * | 4/1992 | Matsumoto et al. ................ 148/33.2 |
| 5,128,280 | * | 7/1992 | Matsumoto et al. ................ 438/504 |
| 5,308,682 | * | 5/1994 | Morikawa ............................ 428/195 |
| 5,475,268 | * | 12/1995 | Kawagoe et al. .................... 257/797 |
| 5,525,841 | * | 6/1996 | Satou .................................. 257/797 |
| 5,640,049 | * | 6/1997 | Rostoker et al. .................... 257/758 |

* cited by examiner

Primary Examiner—Carl Whitehead, Jr.
Assistant Examiner—Maria Guerrero
(74) Attorney, Agent, or Firm—Hayes, Soloway, Hennessey, Grossman & Hage PC

(57) ABSTRACT

A fabrication method for a semiconductor device is provided, which is able to increase pattern-to pattern lithography overlay accuracy. After a first layer made of a first material is formed, first and second slits serving as a first alignment mark are formed in the first layer. The first and second slits are spaced with a specific distance and are approximately parallel to each other. Each of the first and second slits is filled with a second material. Then, a second layer made of a third material is formed on the first layer. Subsequently, a mask is formed on the second layer. The mask has a first pattern serving as a second alignment mark. The second alignment mark is overlapped with the first and second slits serving as the first alignment mark. Preferably, the first alignment mark provides the main scale of a caliper, and the second alignment mark provides the vernier scale of the caliper.

7 Claims, 11 Drawing Sheets

FABRICATION METHOD FOR SEMICONDUCTOR DEVICE UTILIZING PARALLEL ALIGNMENT SLITS

This is a divisional of Ser. No. 08/807,327, filed Feb. 27, 1997 now U.S. Pat. No. 5,949,145.

BACKGROUND OF THE INVENTION

1. Field of the Invention

The present invention relates to a semiconductor device and a fabrication method thereof and more particularly, to a semiconductor device including alignment marks for measuring or estimating lithography overlay accuracy, and a fabrication method thereof.

2. Description of the Prior Art

Recently, miniaturization and integration have been progressing more and more. At present, ultra large-scale integrated semiconductor devices (ULSIs), for example, not only 256-Megabit Dynamic-Random-Access Memories (DRAMs) designed according to 0.25 micron design rule, but also 1 Gigabit DRAMs designed according to sub 0.25 μm design rule, are being developed and examined. In order to deal with this progress in miniaturization and integration, the need for improving or enhancing the pattern-to-pattern (or, mask-to-mask) overlay or registration accuracy in photolithography processes has been becoming greater.

Typically, in semiconductor device fabrication, patterned layers made of metal, semiconductor, dielectric, and so on are successively formed so as to be stacked on a semiconductor substrate, thereby fabricating miniaturized semiconductor devices. In photolithography, it is required that patterns of geometric shapes in an upper level are accurately overlaid with respect to previously defined patterns of geometric shapes in a lower level. The required overlay accuracy for the patterns has been becoming stricter with progressing miniaturization of the semiconductor devices.

Conventionally, two typical measuring methods have been used to measure the overlay or placement error of the patterns. With a first conventional measuring method of this sort, rectangular patterns are formed at a fixed pitch in each layer in each semiconductor chip region. The overlapping or stacking state of the patterns in the two layers gives the degree of overlay error. The rectangular patterns are generally termed the "alignment vernier caliper" or alignment vernier".

With a second conventional measuring method of this sort, which is typical, a "lower alignment box mark" is formed in a lower layer and an "upper alignment box mark" is formed in an upper layer in each semiconductor chip region. The overlapping state of the alignment marks in the two layers gives the degree of overlay error. This method has been typically used in the automatic overlay measuring technique.

FIGS. 1A to 1F show a conventional fabrication method of a DRAM using the first conventional measuring method with the "alignment vernier caliper".

First, as shown in FIG. 1A, a field oxide layer 102 is selectively formed on a main surface of a silicon substrate 101 by a selective oxidation process or the like, defining active regions. For the sake of simplification of description, only one of the active regions is shown in FIGS. 1A to 1F, in which a Metal-Oxide-Semiconductor Field-Effect Transistor (MOSFET) is formed.

Then, a gate oxide layer 104a is selectively formed on the exposed surface of the substrate 101 in the active region. Gate electrodes 103 are formed on the gate oxide layer 104a in the active region. Source/drain regions (not shown) are formed in the active region. Thus, two MOSFETs are adjacently formed in the active region, which serve as transfer transistors of the memory cell. These steps are performed by known processes.

Further, a silicon dioxide ($SiO_2$) layer with a thickness of approximately 800 nm is formed on the whole substrate 101 to cover the MOSFETs by a Chemical Vapor Deposition (CVD) process, or the like. The bottom of the $SiO_2$ layer is contacted with the exposed area of the substrate 104. The surface of the $SiO_2$ layer is then planarized by a Chemical-Mechanical Polishing (OMP) process. Thus, an interlayer insulating layer 104 made of $SiO_2$ is formed on the substrate 101.

The interlayer insulating layer 104 may be formed by a Boron-doped Phosphorsilicate Glass (BPSG) layer whose surface is planarized by a reflow or etch-back process.

A patterned resist mask 105 is formed on the interlayer insulating layer 104. This mask 105 has two square openings 105A for forming contact holes 106 of the source/drain regions and three rectangular openings 105Ba, 105Bb, and 105Bc for forming rectangular recesses 107, 108, and 109 serving as a lower alignment mark. The state at this stage is shown in FIG. 1A.

Using the mask 105, the interlayer insulating layer 104 and the gate oxide layer 104a are selectively removed by an anisotropically dry etching process, thereby forming the square contact holes 106 and the rectangular recesses 107, 108, and 109. The contact holes 106 are located at the corresponding positions to the openings 105A, respectively. The recesses 107, 108, and 109 are located at the corresponding positions to the openings 105Ba, 105Bb, and 105Bc, respectively. The size or width of the contact holes 106 is smaller than that of the recesses 107, 108, and 109. The state at this stage is shown in FIG. 1B.

Subsequently, to fill the contact holes 106, a polysilicon layer 110 with a thickness of 200 nm is deposited on the patterned interlayer insulating layer 104, as shown in FIG. 1C. Each of the contact holes 106 is entirely filled with the polysilicon layer 110. However, since the size (or width) of the recesses 107, 108, and 109 is smaller than that of the contact holes 106, the recesses 107, 108, and 109 are not filled with the polysilicon layer 110. The layer 110 covers the side walls of the recesses 107, 108, and 109 and the exposed surface of the substrate 101. Voids are generated in the respective recesses 107, 108, and 109. The state at this stage is shown in FIG. 1C.

The polysilicon layer 110 thus deposited is then etched back by a dry etching process until the surface of the interlayer insulating layer 104 is exposed. Thus, the polysilicon layer 110 existing in the contact holes 106 is selectively left, thereby forming polysilicon plugs 111. At the same time, the polysilicon layer 110 existing in the recesses 107, 108, and 109 is selectively left, thereby forming polysilicon sidewalls 112. The state at this stage is shown in FIG. 1D.

Further, to form the lower electrodes of the storage capacitors for the MOSFETs, a polysilicon layer 113 with a thickness of approximately 800 nm is deposited on the interlayer insulating layer 104 over the entire substrate 101 by a CVD process. The state at this stage is shown in FIG. 1E.

Depressions are generated in the surface of the polysilicon layer 113 due to the underlying recesses 107, 108, and 109.

To pattern the polysilicon layer 113 thus deposited, a photoresist layer is uniformly formed on the layer 113. Then, to pattern the polysilicon layer 113, the layer 113 is subjected to reduction projection exposure and development processes. The photoresist layer thus patterned has square patterns 114 for forming the lower electrodes, and rectangular patterns 115, 116, and 117 for serving as an upper alignment mark. The state at this stage is shown in FIG. 1F.

The patterns 115, 116, and 117 are located in the depression of the polysilicon layer 113 right over the corresponding recesses 107, 108, and 109, respectively.

The rectangular recesses 107, 108, and 109 in the interlayer insulating layer 104 serve as the lower alignment mark. In other words, these recesses 107, 108, and 109 serve as a main scale of the alignment vernier caliper. The overlying rectangular patterns 115, 116, and 117 serve as the upper alignment mark. In other words, these patterns 115, 116, and 117 serve as a vernier scale of the alignment vernier caliper.

The overlay accuracy of the photoresist patterns 114 is determined or estimated by reading the overlapping state of the patterns 115, 116, and 117 with the corresponding recesses 107, 108, and 109 with the use of an optical microscope. Specifically, the overlapping state of the pattern 115 with the underlying recess 107 is checked. Similarly, the overlapping state of the pattern 116 with the underlying recess 108, and the overlapping state of the pattern 117 with the underlying recess 109 is checked.

Next, the use of the lower and upper alignment marks is explained in more detail with reference to FIGS. 2 and 3.

In FIG. 2, a rectangular mark 121, which corresponds to the recess 107, 108, or 109 in the interlayer insulating layer 104, serves as the lower alignment mark. A rectangular mark 122, which corresponds to the pattern 115, 116, or 117 on the polysilicon layer 113, serves as the upper alignment mark.

To measure or estimate the overlay error of the upper mark 122 with respect to the lower mark 121, the distance X between the edge 121a of the mark 121 and the opposing edge 122a of the mark 122 is measured with the use of an optical microscope. At the same time, the distance Y between the edge 121b of the mark 121 and the opposing edge 122b of the mark 122 is also measured. The overlay error is estimated by the existence or absence of the difference between the distances X and Y.

Next, the measurement principle of the alignment vernier caliper is explained with reference to FIG. 3.

In FIG. 3, as the lower alignment mark, first, second, third, fourth, and fifth rectangular patterns 123, 124, 125, 126, and 127 are formed in parallel. These patterns 123, 124, 125, 126, and 127 are arranged along a straight line at an equal pitch p in a lower level. On the other hand, as the upper alignment mark, first, second, third, fourth, and fifth rectangular patterns 128, 129, 130, 131, and 132 are formed in parallel. The patterns 128, 129, 130, 131, and 132 are arranged along the same straight line at an equal pitch q in an upper level.

It is seen from FIG. 3 that the overlapping state of the second mark 129 with the corresponding second mark 124 is best, because the mark 129 is located at the center of the mark 124, in other words, the distances X and Y in FIG. 2 are equal. Therefore, if the pitches p and q satisfy the equation, $q=p+0.025$ $\mu$m, it is determined that the overlay error is +0.025 $\mu$m in this case. If the overlapping state of the third (i.e., center) mark 129 with the corresponding third (i.e., center) mark 124 is best, the overlay error is measured as 0.

Then, by setting the compensation parameter of the exposure system to a value of +0.025 pm, the overlay accuracy can be improved.

The processes after the step of FIG. 1F may be performed by known, popular processes. Therefore, the explanation of these processes is omitted here for simplicity.

With the conventional fabrication method shown in FIGS. 1A to 1F, a problem exists in that reading or recognition of the upper and lower alignment marks with the optical microscope is very difficult. This difficulty increases with increasing miniaturization of semiconductor devices.

Specifically, after the polysilicon layer 110 is deposited on the patterned interlayer insulating layer 104 to fill the contact holes 106, the polysilicon plugs 111 are formed in the respective contact holes 106 by the etching back process. Therefore, polysilicon sidewalls 112 are inevitably formed in the recesses 107, 108, and 109, respectively. Subsequently, the voids in the recesses 107, 108, and 109 are filled with the polysilicon layer 113 for the lower electrode of the storage capacitor.

Accordingly, each edge of the lower alignment mark is doubled. Specifically, as shown in FIG. 4, the edge 121a in FIG. 2 appears to be two adjacent edges 119a and 120a, and the edge 121b in FIG. 2 appears to be two adjacent edges 119b and 120b. This is because the edges 120a and 120b of the sidewalls 112 are adjacent located to the corresponding top edges 119a and 119b of the recesses 107, 108, and 109, respectively. The doubled edges 119a and 120a and 119b and 120b make it very difficult to visually read out the overlapping state between the upper and lower alignment marks.

Also, due to the existence of the recesses 107, 108, and 109, some depressions are generated in the surface of the polysilicon layer 113, as shown in FIG. 1E. The patterns 115, 116, and 117 of the photoresist layer are located in the depressions, respectively. Therefore, the patterns 115, 116, and 117 tend to have distorted shapes, which increases the difficulty in reading or measuring of the upper and lower alignment marks.

FIG. 5 shows the second conventional measuring method described previously.

In FIG. 5, similar to the device shown in FIGS. 1A to 1F, the interlayer insulating layer 104 is formed on the semiconductor substrate 101. However, unlike the device of FIGS. 1A to 1F, recess 141 has the shape of a rectangular box, the size or width of which is larger than that of the recesses 107, 108, and 109. The four inner walls of the recess 141 are covered with the four polysilicon sidewalls 142, respectively. The bottom wall of the recess 141 is formed by the substrate 101. The recess 141 serves as an "outer alignment box mark".

A polysilicon layer 144 for forming the lower electrode of the storage capacitor is formed on the patterned interlayer insulating layer 104. The layer 144 covers the bottom and side walls of the recess 141.

A pattern 145 of a photoresist layer is formed on the polysilicon layer 144. The pattern has the shape of a rectangular box, the size or width of which is smaller than that of the recess 141. The four outer side walls of the pattern 145 are apart from the opposing walls of the polysilicon layer 144. The bottom wall of the pattern 145 contacts the opposing wall of the polysilicon layer 144. The pattern 145 serves as an "inner alignment box mark".

The pattern 145 serving as the "inner box mark" is located in the recess 141 serving as the "outer box mark". In other words, the pattern 145 is entirely included in the "outer box mark".

By reading or measuring the distances between the four edges of the outer box mark (i.e., the recess 141) and the four opposing edges of the inner box mark (i.e., the pattern 145) thereto, the overlay error of the pattern 145 with respect to the recess 141 can be known.

SUMMARY OF THE INVENTION

Accordingly, an object of the present invention is to provide a semiconductor device that is able to improve the lithography pattern-to-pattern overlay accuracy.

Another object of the present invention is to provide a fabrication method for a semiconductor device that is able to improve lithography pattern-to-pattern overlay accuracy.

According to a first aspect of the present invention, a semiconductor device is provided, which includes a first layer made of a first material. The first layer has first and second slits serving as a first alignment mark. The first and second slits are spaced apart by a specific distance and are approximately parallel to each other. Each of the first and second slits is filled with a second material.

The semiconductor device according to the first aspect further includes a first pattern formed on the first layer. The first pattern is overlapped with the first and second slits. The first pattern is an image or replica of a second pattern on a mask. The second pattern serves as a second alignment mark.

The overlay accuracy of the first pattern with the first layer is given by reading the overlapping state of the second pattern on the mask with the first and second slits.

With the semiconductor device according to the first aspect, the first layer has first and second slits serving as the first alignment mark. The first and second slits are spaced at the specific distance and are approximately parallel to each other. Each of the first and second slits is filled with the second material.

Therefore, no sidewall exists in the first and second slits, respectively. Therefore, no possibility of doubled edges occurs.

Also, since each of the first and second slits is filled with the second material, no depression is formed on the top of the first pattern.

Further, the overlay accuracy of the first pattern with the first layer is given by reading the overlapping state of the second pattern on the mask with the first and second slits. Therefore, the overlay accuracy of the first pattern with the first layer may be known in the lithography process for forming the first pattern.

As a result, pattern-to-pattern overlay accuracy is able to be improved.

In a preferred embodiment of the device according to the first aspect, the first alignment mark provides a main scale of a caliper, and the second alignment mark provides a vernier scale of said caliper.

In another preferred embodiment of the device according to the first aspect, the distance between the first and second slits serving as the first alignment mark is smaller than a width of the first pattern serving as the second alignment mark.

In still another preferred embodiment of the device according to the first aspect, third and fourth slits are additionally formed in the first layer. The third and fourth slits are spaced apart by a specific distance and are approximately parallel to each other. Each of the third and fourth slits is filled with the second material. The first, second, third, and fourth slits are arranged to form a rectangular shape.

In this case, it is preferred that the first alignment mark including the first, second, third, and fourth slits serves as an outer box mark, and the second alignment mark serves as an inner box mark.

In a further preferred embodiment of the device according to the first aspect, the first material is a dielectric material and the first layer serves as an interlayer insulator layer formed on a semiconductor substructure. The second material is a conductive material such as polysilicon, refractory metal such as Ti, W, Ta, Mo, Hf, refractory metal silicide such as $TiSi_2$, $WSi_2$, $TaSi_2$, $MoSi_2$, $HfSi_2$. The third material is a conductive material.

Because the refractory metal and refractory metal silicide are low in electric resistance and easy to use in processing, they are preferable for the present invention.

In a still further preferred embodiment of the device according to the first aspect, the first layer is a semiconductor substrate, and the second material is a dielectric material. This case is preferably applied to the trench isolation structure.

According to the second aspect of the present invention, a fabrication method of a semiconductor device is provided. This method includes the following steps:

(a) A first layer made of a first material is formed.

(b) First and second slits serving as a first alignment mark are formed in the first layer. The first and second slits are spaced at a specific distance and approximately parallel to each other. Each of the first and second slits is filled with a second material.

(c) A second layer made of a third material is formed on the first layer.

(d) A mask is formed on the second layer. The mask has a first pattern serving as a second alignment mark. The second alignment mark is overlapped with the first and second slits serving as the first alignment mark.

(e) The second layer is patterned using the mask to thereby form a second pattern which is an image or replica of the first pattern.

The overlay accuracy of the second pattern with the first layer is given by reading the overlapping state of the first pattern on the mask with the first and second slits between the steps (d) and (e).

With the fabrication method of a semiconductor device according to the second aspect, for the same reasons as described in connection with the semiconductor device according to the first aspect, pattern-to-pattern overlay accuracy may be improved.

In a preferred embodiment of the method according to the second aspect, the first alignment mark provides a main scale of a caliper, and the second alignment mark provides a vernier scale of the caliper.

In another preferred embodiment of the method according to the second aspect, the distance between the first and second slits serving as the first alignment mark is smaller than a width of the first pattern serving as the second alignment mark.

In still another preferred embodiment of the method according to the second aspect, third and fourth slits are additionally formed in the first layer in the step (b). The third and fourth slits are spaced at a specific distance and approximately parallel to each other. Each of the third and fourth slits is filled with the second material. The first, second, third, and fourth slits are arranged so as to form a rectangular shape.

In this case, it is preferred that the first alignment mark including the first, second, third, and fourth slits serves as an outer box mark, and the second alignment mark serves as an inner box mark.

In a further preferred embodiment of the method according to the second aspect, the first material is a dielectric material and the first layer serves as an interlayer insulator layer formed on a semiconductor substructure. The second material is a conductive material such as polysilicon, refractory metal such as Ti, W, Ta, Mo, Hf, refractory metal silicide such as $TiSi_2$, $WSi_2$, $TaSi_2$, $MoSi_2$, $HfSi_2$. The third material is a conductive material.

Because the refractory metal and refractory metal silicide are low in electric resistance and easy to use in processing, they are preferable for the present invention.

In a still further preferred embodiment of the method according to the second aspect, the first layer is a semiconductor substrate, and the second material is a dielectric material. This case is preferably applied to the trench isolation structure.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described below with reference to the drawings attached.

FIRST EMBODIMENT

A fabrication method for a semiconductor device, i.e., a DRAM, according to a first embodiment is shown in FIGS. 6A to 6G.

Figure 6A:
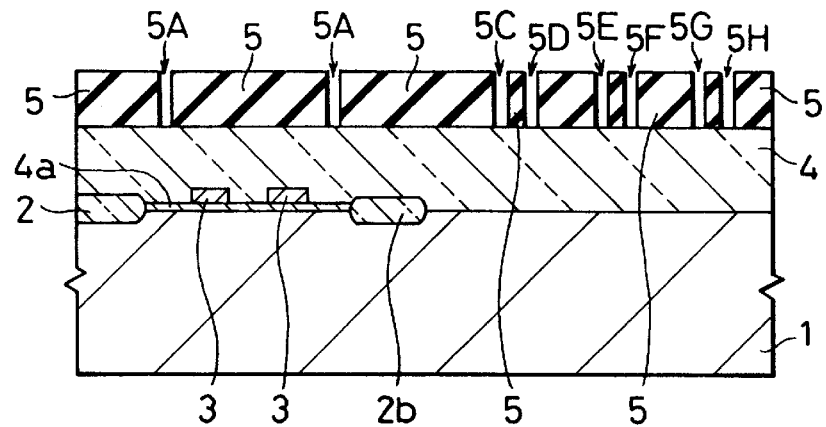
FIGS. 6A to 6G are partial cross-sectional views showing a fabrication method for a semiconductor device according to a first embodiment of the present invention.

First, as shown in FIG. 6A, a field oxide layer 2 is selectively formed on a main surface of a silicon substrate 1 by a selective oxidation process or the like, thereby defining active regions. For the sake of simplification of description, only one of the active regions is shown in FIG. 6A to 6G, which active region is for a MOSFET.

Then, a gate oxide layer 4a is selectively formed on the exposed surface of the substrate 1 in the active region. Gate electrodes 3 are formed on the gate oxide layer 4a in the active regions. Source/drain regions (not shown) are formed in the active region of the substrate 1. Thus, two MOSFETs are formed in the active region as transfer transistors of the memory cell. These steps are performed by known processes.

Further, a $SiO_2$ layer with a thickness of approximately 800 nm is formed on the whole substrate 1 to cover the MOSFETs by a CVD process or the like. The bottom of the $SiO_2$ layer contacts exposed area of the substrate 1. The surface of the $SiO_2$ layer is then planarized by a CMP process. Thus, an interlayer insulating layer 4 is formed on the substrate 1.

The interlayer insulating layer 4 may be formed by BPSG layer whose surface is planarized by a reflow or etch-back process.

A patterned resist mask 5 is formed on the interlayer insulating layer 4. This mask 5 has two square openings 5A for forming contact holes 6 of the source/drain regions and six elongated openings 5C, 5D, 5E, 5F, 5G, and 5H for forming slits 7a, 7b, 8a, 8b, 9a, and 9b serving as a lower alignment mark. The state at this stage is shown in FIG. 6A.

Figure 7:
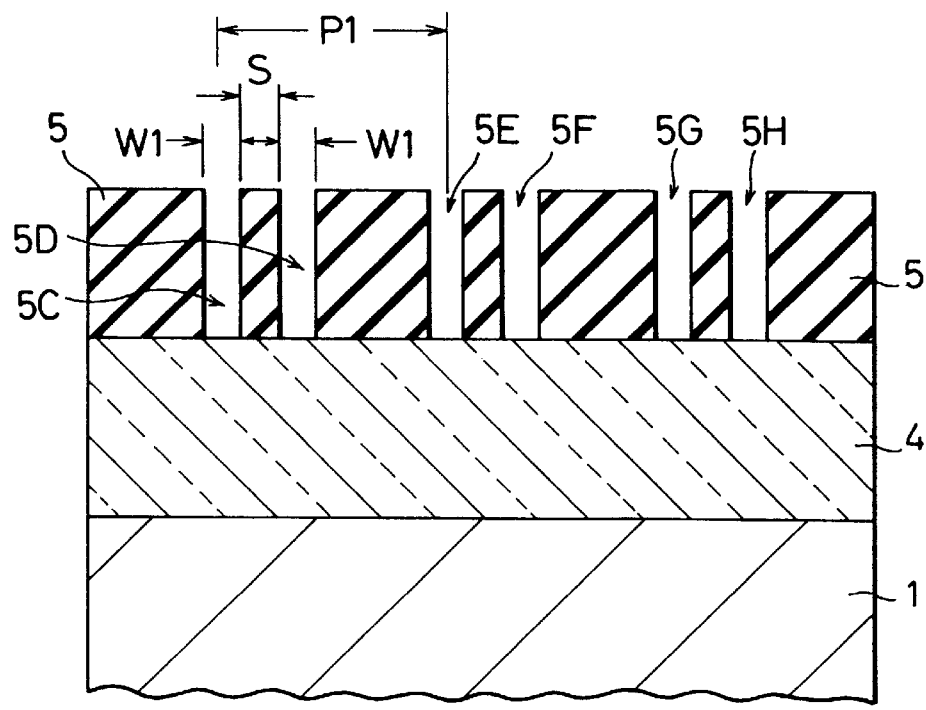
FIG. 7 is an enlarged view of FIG. 6A, which shows the detailed structure of the lower alignment mark.

The openings 5A have shape and the same size. The openings 5C, 5D, 5E, 5F, 5G, and 5H have the same shape and size. As shown in FIG. 7, openings 5A have a width W1. The openings 5C, 5D, 5E, 5F, 5G, and 5H have the same width W1. The opposing inner walls of the openings 5C and 5D have a width of S. The opposing inner walls of the openings 5E and 5F and those of the openings 5G and 5H has the same width of S. The pitch of the slits 5C, 5E, and 5G is P1. The pitch of the slits 5D, 5F, and 5H is also P1.

Figure 6B:
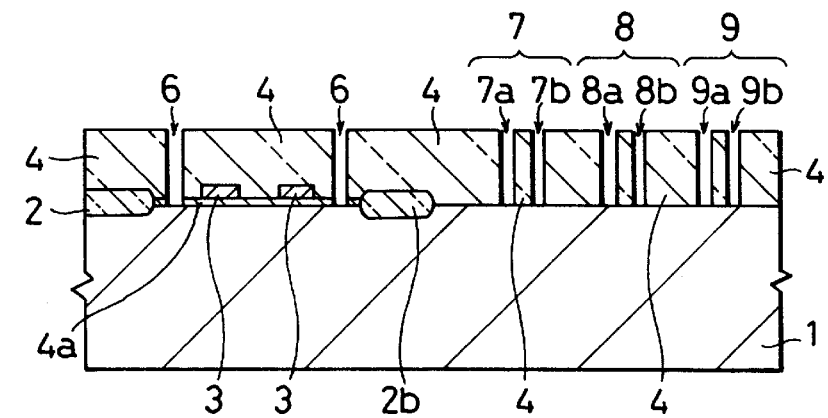

Using the mask 5, the interlayer insulating layer 4 is selectively removed by an anisotropically dry etching process, thereby forming the square contact holes 6 and the slits 7a, 7b, 8a, 8b, 9a, and 9b. The contact holes 6 are located at positions corresponding to the openings 5A, respectively. The recesses 7a, 7b, 8a, 8b, 9a, and 9b are located at positions corresponding to the openings 5C and 5D, 5E and 5F, and 5G and 5H, respectively. The state at this stage is shown in FIG. 6B.

The contact holes 6 have the same shape and size. The slits 7a, 7b, 8a, 8b, 9a, and 9b have the same shape and size. Further, the width of the contact holes 6 is equal to the width of the slits 7a, 7b, 8a, 8b, 9a, and 9b. The slits 7a and 7b form a first slit pair. Slits 8a and 8b form a second slit pair. The slits 9a and 9b form a third slit pair.

Figure 8:
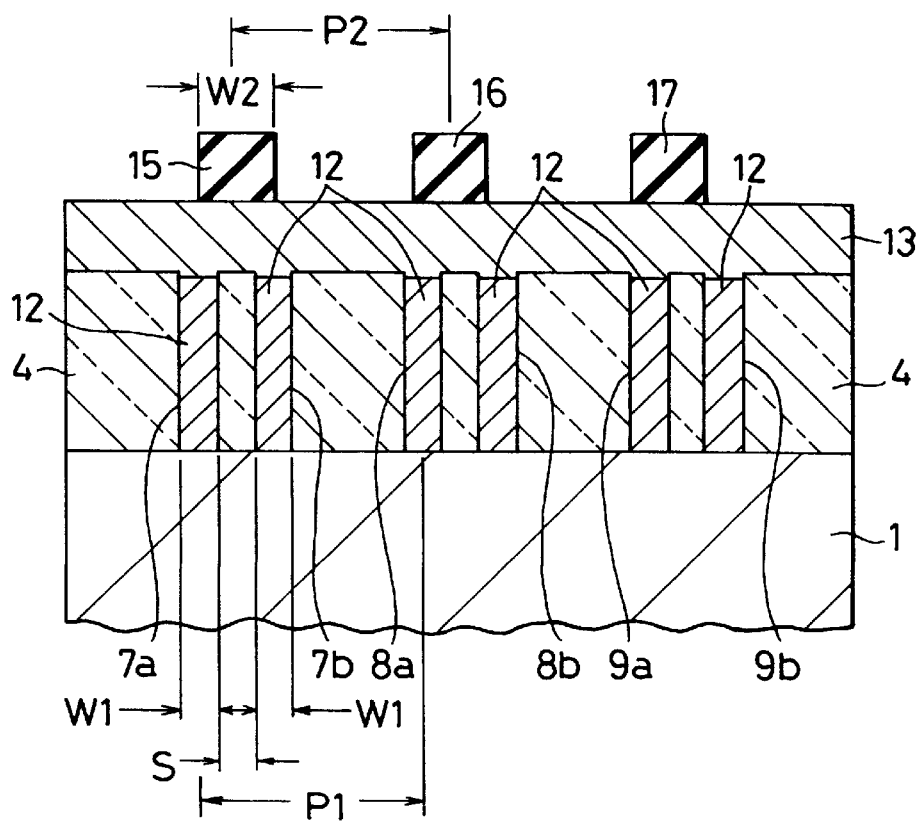
FIG. 8 is an enlarged view of FIG. 6F, which shows the detailed structure of the upper and lower alignment marks.

As shown in FIG. 8, the contact holes 6 and slits 7a, 7b, 8a, 8b, 9a and 9b have a width W1. The opposing inner walls of the slits 7a and 7b have a width S. The opposing inner walls of the slits 8a and 8b and those of the slits 9a and 9b have the same width S. The pitch of the slits 7a, 8a, and 9a is P1. The pitch of the slits 7b, 8b, and 9b is also P1.

Figure 6C:
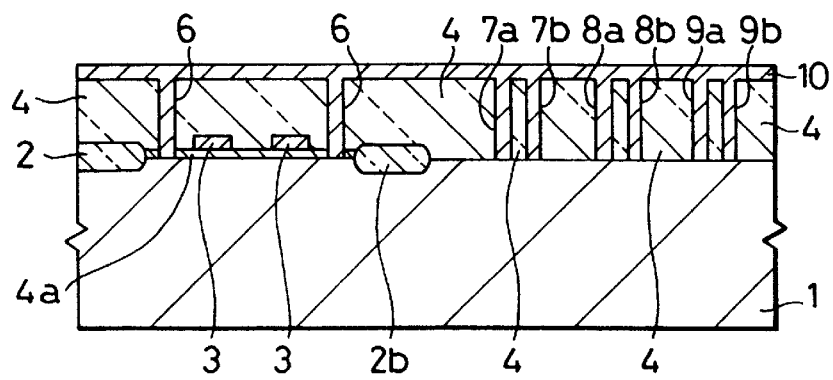

Subsequently, to fill not only the contact holes 6 but also the slits 7a, 7b, 8a, 8b, 9a, and 9b, a polysilicon layer 10 with a thickness of approximately 700 nm is deposited on the patterned interlayer insulating layer 4 by a CVD process, as shown in FIG. 6C. Each of the contact holes 6 is entirely filled with the polysilicon layer 10. Similarly, since the width of the slits 7a, 7b, 8a, 8b, 9a, and 9b is equal to that of the contact holes 6, the slits 7a, 7b, 8a, 8b, 9a, and 9b also are entirely filled with the polysilicon layer 10. The state at this stage is shown in FIG. 6C.

The width W1 of the slits 7a, 7b, 8a, 8b, 9a, and 9b and the width of the contact holes 6 are set as, for example, 0.3 µm. To ensure the entire or complete filling of the slits 7a, 7b, 8a, 8b, 9a, and 9b and the contact holes 6, the thickness of the polysilicon layer 10 is set as twice the width of the slits 7a, 7b, 8a, 8b, 9a, and 9b and the contact holes 6 or more.

Figure 6D:
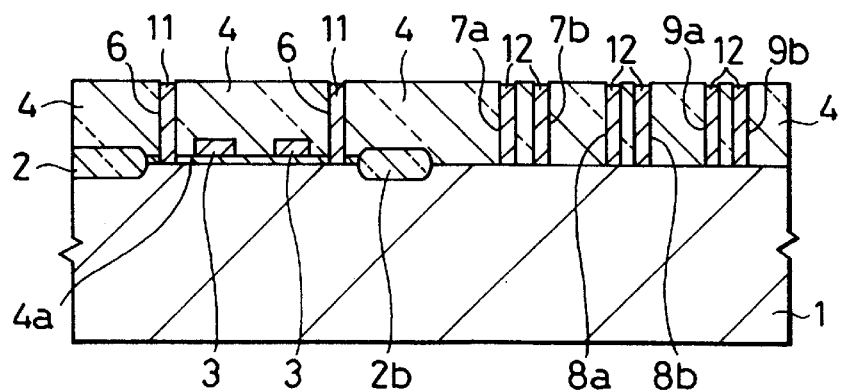

The polysilicon layer 10 thus deposited is then etched back by a dry etching process until the surface of the interlayer insulating layer 4 is exposed. Thus, the polysilicon layer 10 existing in the contact holes 6 and slits 7a, 7b, 8a, 8b, 9a, and 9b are selectively left, thereby forming polysilicon plugs 11 therein. At the same time, the polysilicon layer 10 existing in the slits 7a, 7b, 8a, 8b, 9a, and 9b is selectively left, thereby forming polysilicon plugs 12 therein. The state at this stage is shown in FIG. 6D.

Figure 6E:
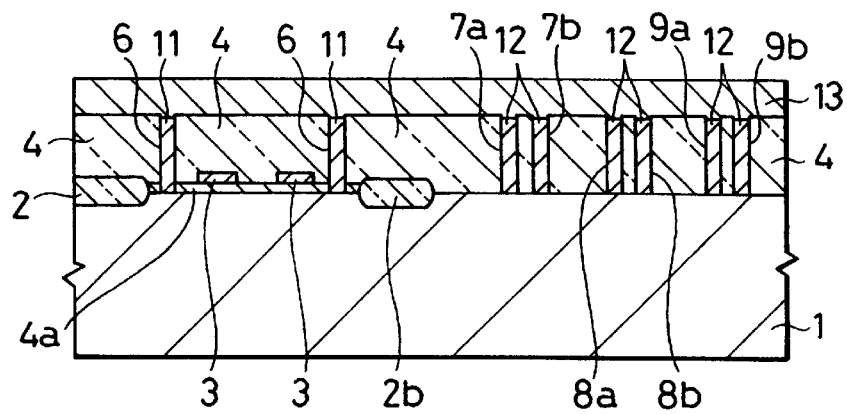

Further, to form lower electrodes of the storage capacitors for the MOSFETs, a polysilicon layer 13 with a thickness of approximately 800 nm is deposited on the interlayer insulating layer 4 over the entire substrate 1 by a CVD process. The state at this stage is shown in FIG. 6E.

Figure 6F:
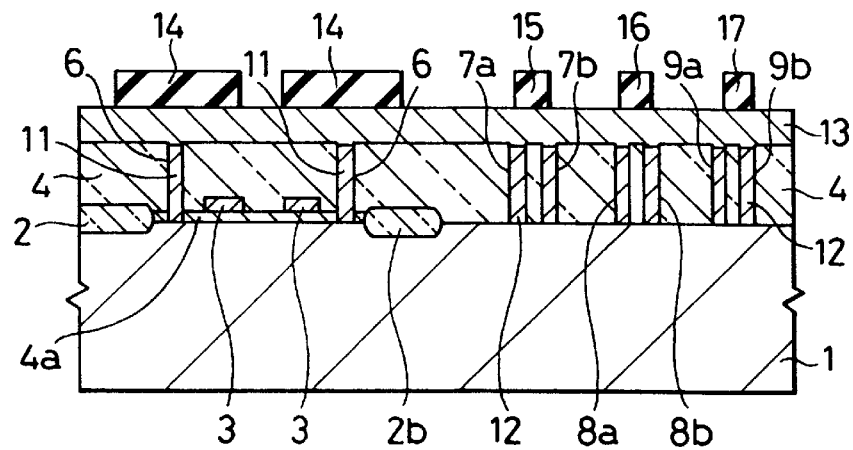
Figure 6G:
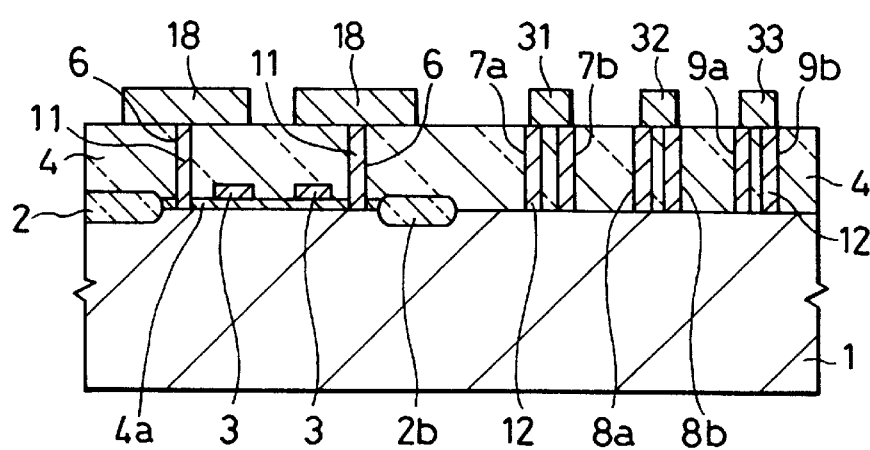

To pattern the polysilicon layer 13 thus deposited, a photoresist layer is uniformly formed on the layer 13. Then, to pattern the polysilicon layer 13, the layer 13 is subjected to a reduction projection exposure and development processes. The photoresist layer thus patterned has square patterns 14 for forming the lower electrodes, and first, second, and third rectangular patterns 15, 16, and 17 for serving an upper alignment mark. The state at this stage is shown in FIG. 6F.

As shown in FIG. 8, the patterns 14 are located over the corresponding contact holes 11, respectively. The patterns 15, 16, and 17 are located over the corresponding slit pairs 7, 8, and 9, respectively. The width of the patterns 14 is optionally set to a desired value. The width of the patterns 15, 16, and 17 as set to W2, smaller than W1, and the pitch thereof is P2, smaller or larger than P1.

For example, W2 is set to 1.7 µm, when Wi is 0.3 µm. The length L1 of the slits 7a, 7b, 8a, 8b, 9a, and 9b is set to 12 µm, and the length L2 of the pattern 15, 16, and 17 is set to 12 µm (see FIG. 9). The pitch P1 of the slits 7a, 7b, 8a, 8b, 9a, and 9b is set to 6 µm, and the pitch P2 of the patterns 15, 16, and 17 is set as 5.75 µm.

The slits 7a, 7b, 8a, 8b, 9a, and 9b in the interlayer insulating layer 4 serve as the lower alignment mark, and the patterns 15, 16, and 17 serve as the upper alignment mark. The overlay accuracy of the pattern 14 on the photoresist layer is checked or estimated by reading the overlapping state of the patterns 15, 16, and 17 with the corresponding pairs 7, 8, and 9 with the use of an optical microscope.

Specifically, the overlapping state of the first slit pair 7 comprising the slits 7a and 7b with the overlying first pattern 15 is measured using an optical microscope. Similarly, the overlapping state of the second slit pair 8 comprising the slits 8a and 8b with the overlying second pattern 16 is measured, and the overlapping state of the third slit pair 9 comprising the slits 9a and 9b with the overlying third pattern 17 is measured in the same way.

Next, the use of the lower and upper alignment marks is explained in more detail with reference to FIG. 9.

Figure 9:
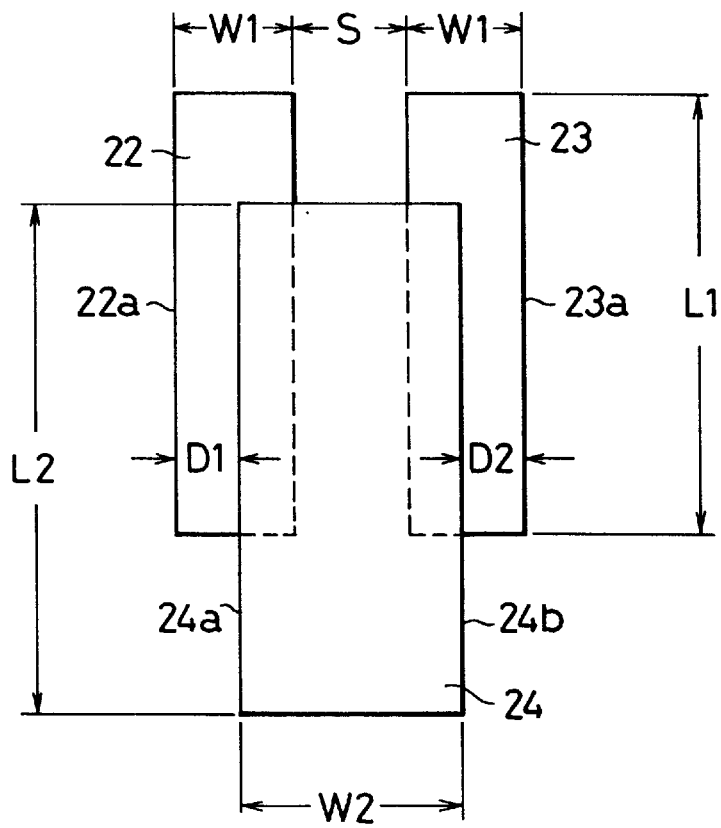
FIG. 9 is a plan view of the overlapping state of the slits and the pattern used in the method according to the first embodiment of FIGS. 6A to 6G, which shows the measuring principle for overlay error.

In FIG. 9, two slits 22 and 23 correspond to each slit pair 7, 8, or 9 comprising the slits 7a and 7b, 7c and 7d, or 7e and 7f in the interlayer insulating layer 4, each of which is filled with a polysilicon plug 12. A rectangular pattern 24 corresponds to the pattern 15, 16, or 17. The slits 22 and 23 serve as the lower alignment mark. The pattern 24 serves as the upper alignment mark.

To estimate the overlay error of the slits 22 and 23 with respect to the pattern 24, the distance D1 between the edge 22a of the slit 22 and the opposing edge 24a of the pattern 24, and the distance D2 between the edge 23a of the slit 23 and the opposing edge 24b of the pattern 24 are measured with the use of an optical microscope. The overlay error is estimated by the existence/absence and magnitude of the difference between the distances D1 and D2.

Therefore, the measuring operation is readily performed by simply reading the opposing edges 22a and 24a and 23a and 24b. Since the slits 7a, 7b, 8a, 8b, 9a and 9b are filled with polysilicon plugs 12, respectively, they have no sidewalls. This means that no doubling phenomenon of the edges of the slits 7a, 7b, 8a, 8b, 9a and 9b, thereby improving the overlay accuracy.

Additionally, since each of the slits 7a, 7b, 8a, 8b, 9a and 9b is entirely filled with polysilicon, no depression is formed on the top of the patterns 15, 16 and 17. This helps to improve the overlay accuracy.

The principle of the "alignment vernier caliper" is the same as that of the conventional one which is previously explained with reference to FIG. 3.

As the lower alignment mark, the first, second, and third slit pairs 7, 8, and 9 are formed in parallel, and arranged along a straight line at the pitch P1 in a lower level. On the other hand, as the upper alignment mark, first, second, and third rectangular patterns 15, 16, and 17 are formed in parallel, and arranged along the same straight line at the pitch P2 in an upper level.

Figure 1A:
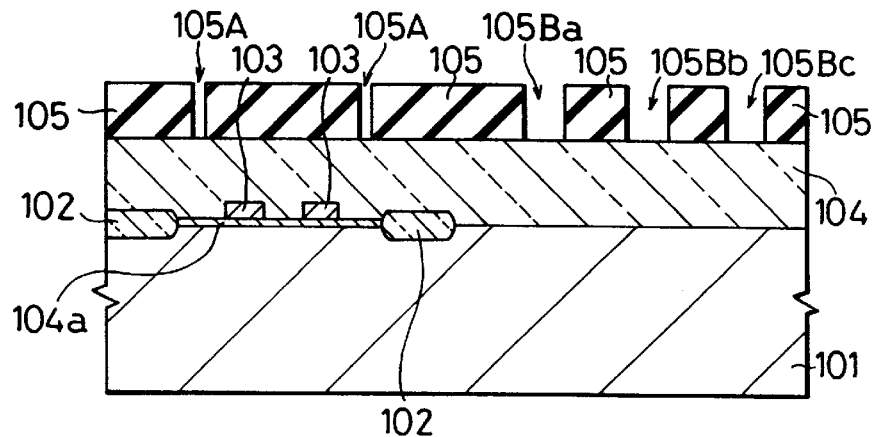
FIGS. 1A to 1F are partial cross-sectional views showing a conventional fabrication method of a semiconductor device.
Figure 1B:
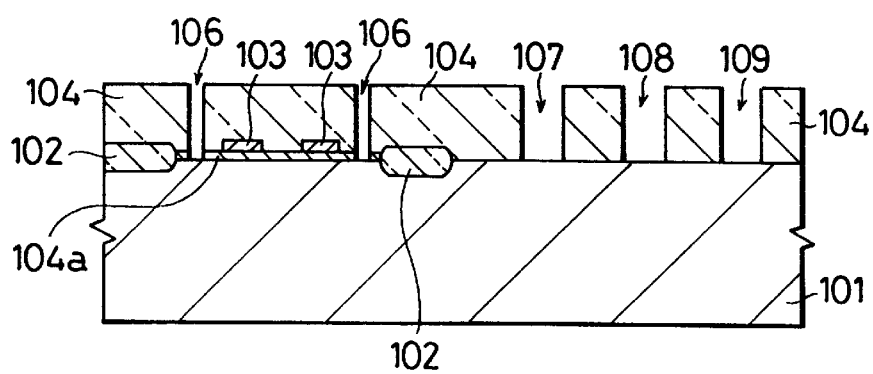
Figure 1C:
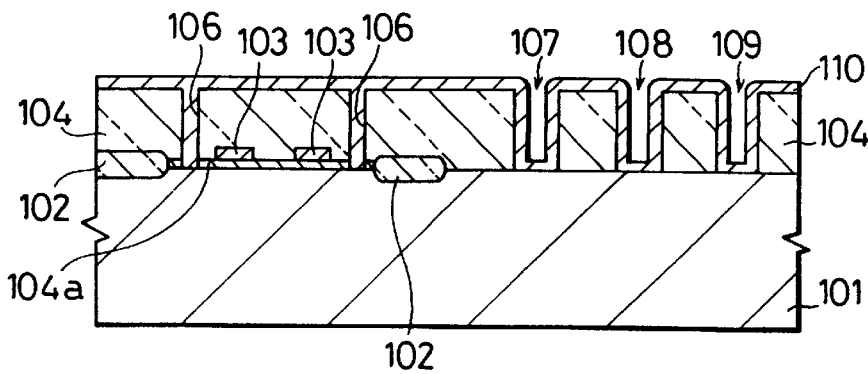
Figure 1D:
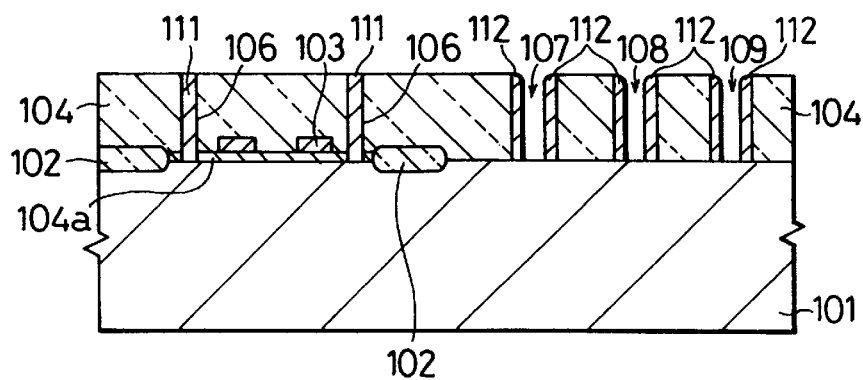
Figure 1E:
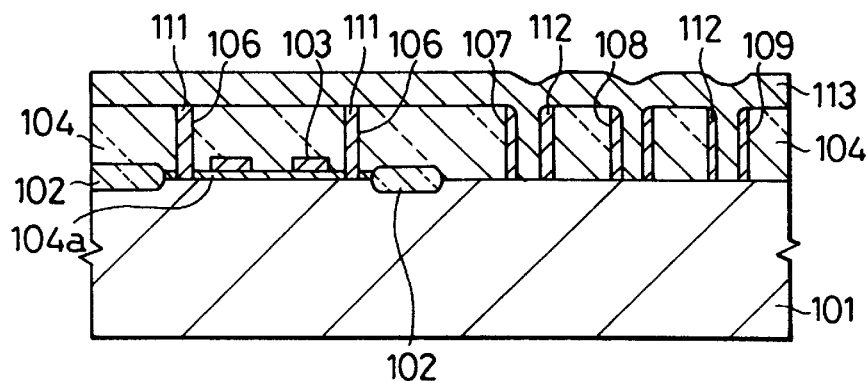
Figure 1F:
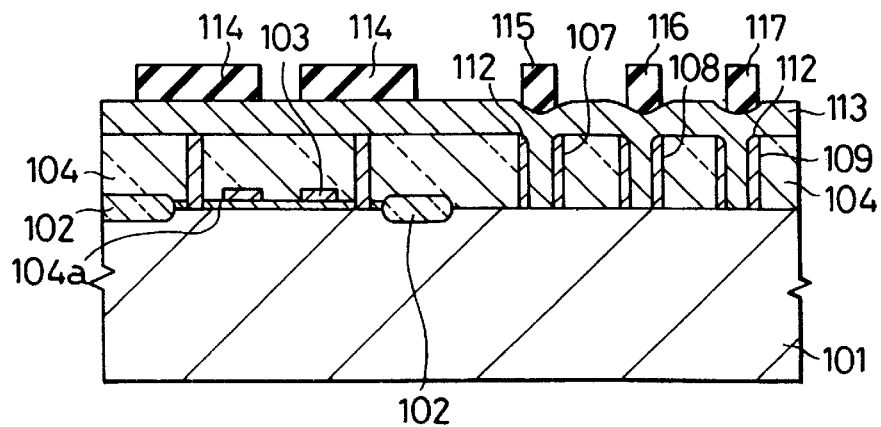
Figure 2:
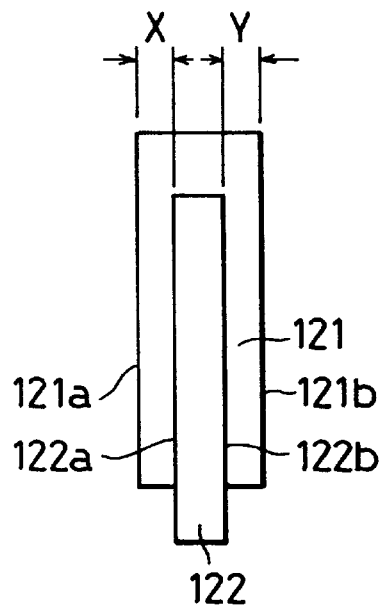
FIG. 2 is a plan view of the overlapping state of the recess and pattern used in the conventional method of FIGS. 1A to 1F, which shows the measuring principle for overlay error.
Figure 3:
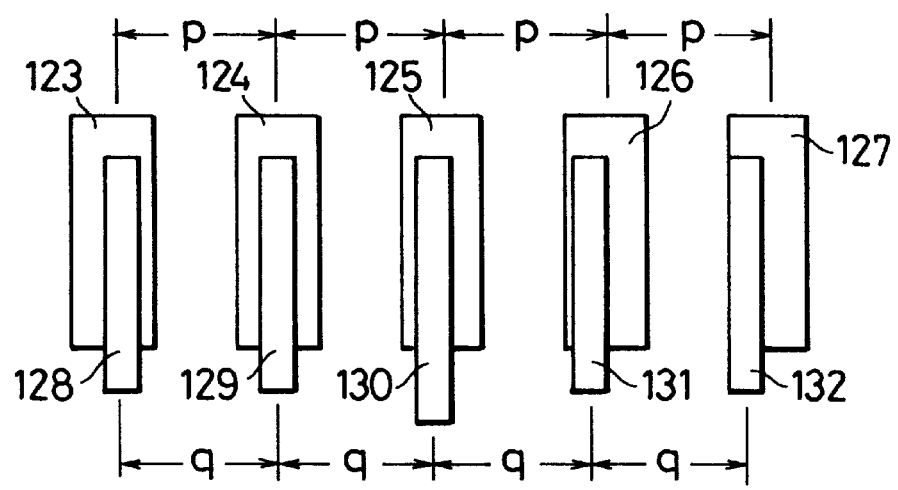
FIG. 3 is a plan view of the overlapping state of the recesses and patterns used in the conventional method of FIGS. 1A to 1F, which shows the measuring principle of the overlay error.
Figure 4:
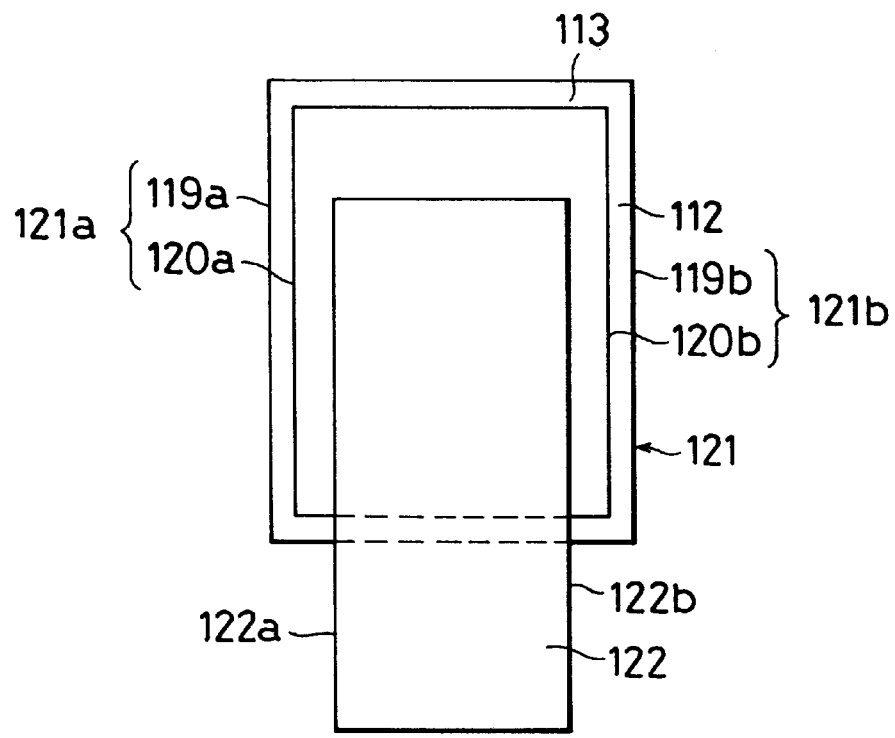
FIG. 4 is a plan view of the overlapping state of the recess and pattern used in the conventional method of FIGS. 1A to 1F, which shows the doubled edges of the recess.
Figure 5:
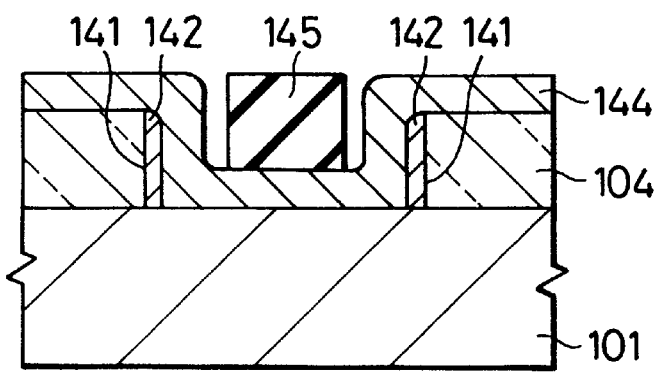
FIG. 5 is a partial cross-sectional view showing the upper and lower alignment box marks used in another conventional fabrication method for a semiconductor device.

In the same way as shown in FIG. 3, the overlapping state of the first, second, and third patterns with the corresponding first, second, and third slit pairs 7, 8, and 9, is read out. Then, by setting the compensation parameter of the exposure system as the measured value, the improvement of the overlay accuracy can be ensured.

After the step of FIG. 6F, the polysilicon layer 13 is patterned with the use of the mask. Thus, the images or replica of the patterns 14 serving as the lower electrodes 18 of the storage capacitors are formed on the interlayer insulating layer 4, respectively. At the same time, patterns 31, 32, and 33 are formed on the layer 4 as the image or replica of the patterns 15, 16, and 17, respectively.

The subsequent process steps may be performed by known processes. Therefore, explanation of these processes is omitted here.

SECOND EMBODIMENT

Figure 10:
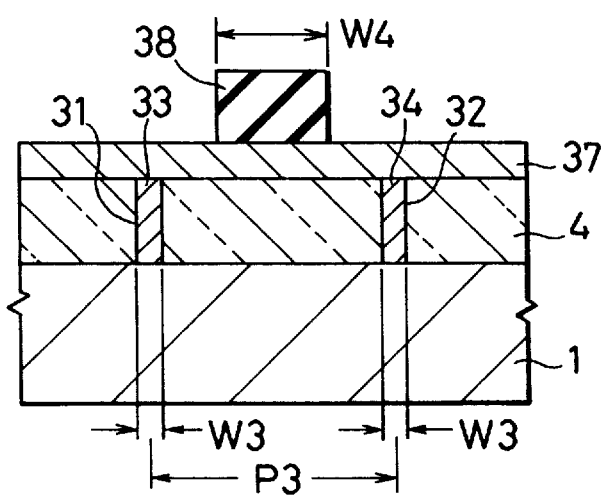
FIG. 10 is a partial cross-sectional view of a semiconductor device, which shows a fabrication method for a semiconductor device according to a second embodiment of the present invention.
Figure 11:
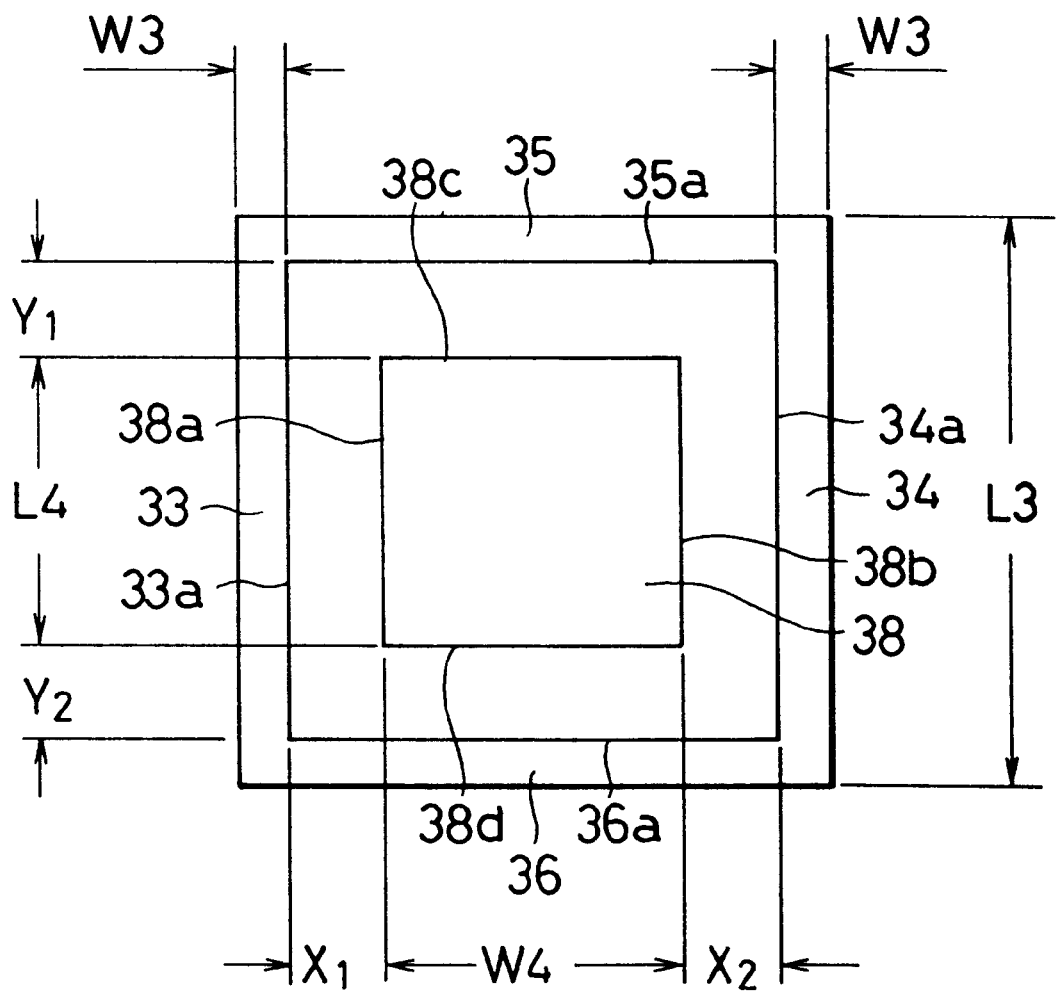
FIG. 11 is a partial plan view of the semiconductor device as shown in FIG. 10, which shows the overlapped upper and lower alignment box marks.

A fabrication method of a semiconductor device according to a second embodiment is shown in FIGS. 10 and 11, in which outer and inner alignment box marks for the automatic overlay measurement are used.

As shown in FIGS. 10 and 11, four slits 33, 34, 35, and 36 are formed so as to define a square shape in the interlayer insulating layer 4 formed on the silicon substrate 1. The substrate 1 and the interlayer insulating layer 4 are the same as those in the first embodiment. The slits 33, 34, 35, and 36 serve as the outer alignment box mark.

The opposing slits 33 and 34 are arranged in parallel at a pitch P3. The opposing slits 35 and 36 are arranged in parallel at the same pitch P3, and perpendicular to the slits 33 and 34. The four slits 33, 34, 35, and 36 have the same width of W3 and the same length L3. The width W3 is, for example, set to approximately 0.5 µm. The length L3 is suitably determined as necessary.

The slits 33, 34, 35, and 36 are filled with a suitable conductive or insulative material 34 such as polysilicon, $SiO_2$, or the like.

A square pattern 38 of a photoresist layer is formed on layer 37. The layer 37 is formed on the interlayer insulating layer 4 so as to cover the outer box mark (i.e., the slits 33, 34, 35, and 36), and may be made of any material $SiO_2$, polysilicon, or the like, as necessary. The pattern 38 is located so that the four edges 38a, 38b, 38c, and 38d are parallel to the opposing four edges 33a, 34a, 35a, and 36a of the slits 33, 34, 35, and 36, respectively. The pattern 38 serves as the inner alignment box mark.

The square pattern 38 has a width of W4 and length L4 equal to W4. The width W4 and length L4 are suitably determined as necessary.

As shown in FIG. 11, the distance of the edge 38a of the pattern 38 and the opposing edge 33a of the slit 33 is X1. The distance of the edge 38b of the pattern 38 and the opposing edge 34a of the slit 34 is X2. The distance of the edge 38c of the pattern 38 and the opposing edge 35a of the slit 3S is Y1. The distance of the edge 38d of the pattern 38 and the opposing edge 36a of the slit 36 is Y2.

The outer and inner box marks described above may be formed by the same process sequence as that of the first embodiment, except that, the four slits 33, 34, 35, and 36 are formed in the interlayer insulating layer 4, and that the single square pattern 38 has a smaller size than that of the outer alignment box mark and is formed so as to be located inside the outer alignment box mark.

The above-described outer and inner alignment box marks are used for the automatic overlay measurement as follows.

After the outer and inner alignment box marks arc formed, a laser beam is scanned across these box marks to thereby measure or recognize the positional relationship between the outer and inner box marks. This scanning of the laser beam and position measurement are automatically performed. Thus, the overlay state of the pattern 38 in the upper level with the slits 33, 34, 35, and 36 in the lower level is automatically measured.

With the fabrication method according to the second embodiment, since the four slits 33, 34, 35, and 36 are formed in the interlayer insulating layer 4 and filled with the specific material 33 or 34, no doubling phenomenon of the edges occurs. Also, no depression is generated in the surface of the layer 37 due to the filling of the slits 33, 34, 35, and 36, and therefore, the shape of the pattern 38 has a low possibility of distortion.

As a result, not only the edges 33a, 34a, 35a, and 36a of the slits 33, 34, 35, and 36, but also the edges 38a, 38b, 38c, and 38d of the pattern 38 can be clearly detected by the scanning laser beam. This decreases automatic overlay measurement error. In other words, this improves pattern-to-pattern overlay accuracy.

THIRD EMBODIMENT

Figure 12:
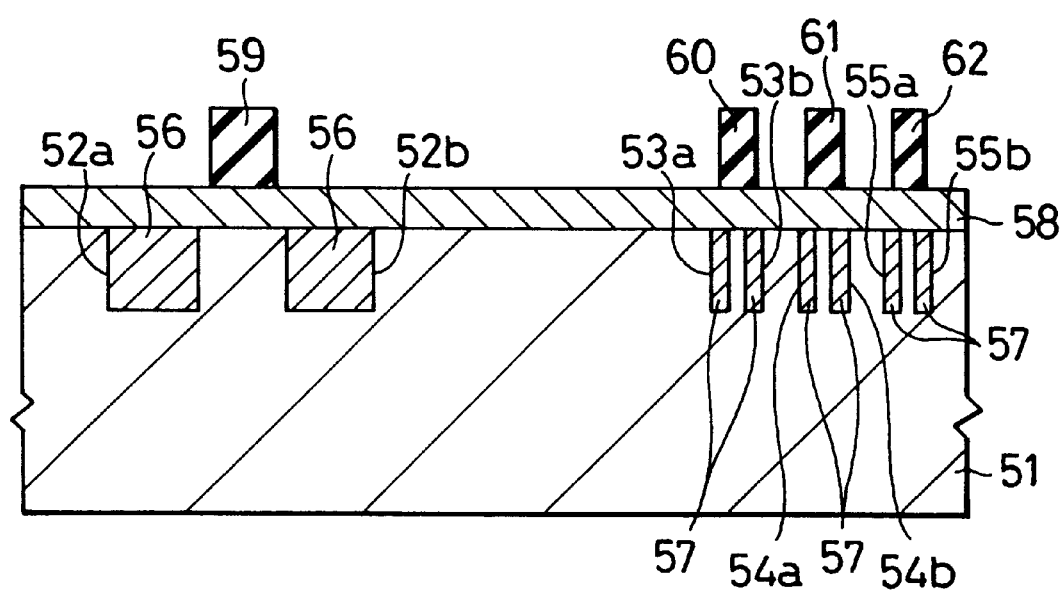
FIG. 12 is a partial cross-sectional view of a semiconductor device, which shows a fabrication method for a semiconductor device according to a third embodiment of the present invention.

A fabrication method of a semiconductor device according to a third embodiment is shown in FIG. 12.

In the above first and second embodiments, the present invention is applied to the overlay measurement of the lower electrodes of the storage capacitors with respect to the underlying contact holes in the DRAM memory cell. In these embodiments, the edges of the slits formed in the interlayer insulating layer 4 provide the main scale of the vernier caliper, and the edges of the resist pattern or patterns formed in the resist layer provide the vernier scale thereof.

However, the present invention may be applied to the well-known trench isolation structure, as shown in the third embodiment explained below.

The fabrication method according to the third embodiment is substantially the same as that according to the first embodiment, except that the slits in the interlayer insulating layer are formed in a semiconductor substrate.

First, as shown in FIG. 12, a patterned masking layer (not shown) is formed on a main surface of a silicon substrate 51. Then, using the masking layer, the main surface of the substrate 51 is selectively etched by a dry etching process or the like, forming isolation trenches 52a and 52b and slits 53a, 53b, 54a, 54b, 55a, and 55b in the substrate 51. The slits 55a, 53b, 54a, 54b, 55a, and 55b serve as a lower alignment mark.

For the sake of simplification of description, only two trenches for a MOSFET are shown in FIG. 12.

Next, a $SiO_2$ layer is deposited on the main surface of the substrate 51 by a CVD process, and is etched back, thereby filling the trenches 52a and 52b with the $SiO_2$ 56, and the slits 53a, 53b, 54a, 54b, 55a, and 55b with the $SiO_2$ 57. Then, the surface of the remaining $SiO_2$ layer in the trenches 52a and 52b and the slits 53a, 53b, 54a, 54b, 55a, and 55b is planarized by a conventional process.

Then, a gate oxide layer (not shown) is selectively formed on the surface of the substrate 51. A polysilicon layer 58 for forming a gate electrode is deposited so as to cover the gate oxide layer over the whole substrate 51 by a CVD process, or the like.

Further, a patterned resist mask is formed on the polysilicon layer 58. This mask has a square pattern 59 for forming a gate electrode and three elongated patterns 60, 61, and 62 for the upper alignment mark. The pattern 59 is located over approximately the center between the trenches 52a and 52b. The patterns 60, 61, and 62 are located over the corresponding slits 53a, 53b, 54a, 54b, 55a, and 55b, respectively. The state at this stage is shown in FIG. 12.

The trenches 52a and 52b have the same shape and size. The slits 53a, 53b, 54a, 54b, 55a, and 55b correspond to the slits 7a, 7b, 8a, 8b, 9a, and 9b in the first embodiment, respectively. The pattern 59 corresponds to the pattern 14 in the first embodiment. The patterns 60, 61, and 62 correspond to the patterns 15, 16, and 17 in the first embodiment, respectively.

The overlapping state of the first slit pair made of the slits 53a and 53b with the overlying first pattern 60 is measured using an optical microscope. Similarly, the overlapping state of the second slit pair comprising the slits 54a and 54b with the overlying second pattern 61 is measured, and the overlapping state of the third slit pair comprising the slits 55a and 55b with the overlying third pattern 62 is measured in the same way.

The edges of the slits 53a, 53b, 54a, 54b, 55a, and 55b serve as the main scale of a vernier caliper, and the edges of the patterns 60, 61, and 62 serve as the vernier scale thereof. This is the same as that shown in the first embodiment.

It is clear that the same advantage as that of the first embodiment is obtained in the third embodiment.

In the above first to third embodiments, polysilicon is used as the filling material of the slits. However, it is needless to say that any other material may be used for this material. Any refractory metal or a silicide of any refractory metal may preferably be used.

Further, it is obvious that the present invention is not limited to DRAMs, and that it may be applied to any other semiconductor device.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A fabrication method of a semiconductor device comprising the steps in sequence of:

(a) forming a first layer made of a first material;

(b) forming in a surface of said first layer pairs of first and second slits serving as a first alignment mark in said first layer;

said first and second slits of each pair being spaced at a specific distance and approximately parallel to each other;

(c) completely filling each of said first and second slits to the surface of said first layer with a second material;

(d) forming a second layer made of a third material on said first layer and on exposed surfaces of said second material in said first and second slits;

(e) forming a mask on said second layer;

said mask having a first pattern serving as a second alignment mark;

said second alignment mark being overlapped with said pairs of first and second slits serving as said first alignment mark; and (f) patterning said second layer using said mask to thereby form a second pattern which is an image or replica of said first pattern;

wherein overlay accuracy of said second pattern with said first layer is measured by reading the overlapping state of said first pattern on said mask with said pairs of first and second slits between the steps (e) and (f).

2. The method as claimed in claim 1, wherein said first material is a dielectric material and said first layer serves as an interlayer insulator layer formed on a semiconductor substructure;

and wherein said second material is a conductive material and said third material is a conductive material.

3. The method as claimed in claim 1, wherein said first layer is a semiconductor substrate, and said second material is a dielectric material.

4. The method as claimed in claim 1, wherein said first alignment mark provides a main scale of a caliper, and said second alignment mark provides a vernier scale of said caliper.

5. The method as claimed in claim 1, wherein said first layer has third and fourth slits;

wherein said third and fourth slits are spaced at a specific distance and approximately parallel to each other;

and wherein each of said third and fourth slits is completely filled with said second material;

and wherein said first, second, third, and fourth slits are arranged to form a rectangular shape.

6. The method as claimed in claim 4, wherein the distance between said first and second slits serving as said first alignment mark is smaller than a width of said first pattern serving as said second alignment mark.

7. The method as claimed in claim 1, wherein said first alignment mark including said first, second, third, and fourth slits serves as an outer box mark;

and wherein said second alignment mark serves as an inner box mark.

* * * * *

UNITED STATES PATENT AND TRADEMARK OFFICE
CERTIFICATE OF CORRECTION

PATENT NO.    : 6,316,328 B1
DATED         : November 13, 2001
INVENTOR(S)   : Masahiro Komuro It is certified that error appears in the above-identified patent and that said Letters Patent is hereby corrected as shown below:

<u>Column 14,</u>
Line 4, "(c)" should be -- (e) --

Signed and Sealed this

Twenty-eighth Day of May, 2002

*Attest:*

JAMES E. ROGAN
*Director of the United States Patent and Trademark Office*

*Attesting Officer*